(12) United States Patent
Cheng et al.

(10) Patent No.: US 11,244,891 B1
(45) Date of Patent: Feb. 8, 2022

(54) INTEGRATED CIRCUIT PACKAGE AND DIE

(71) Applicant: Novatek Microelectronics Corp., Hsinchu (TW)

(72) Inventors: Jhih-Siou Cheng, New Taipei (TW); Hong-Dyi Chang, Hsinchu (TW); Chun-Wei Kang, Hsinchu (TW); Chun-Fu Lin, Taoyuan (TW); Ju-Lin Huang, Hsinchu County (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/934,016

(22) Filed: Jul. 21, 2020

(51) Int. Cl.
*H01L 23/498* (2006.01)
*H01L 23/00* (2006.01)
*H01L 25/18* (2006.01)
*H01L 25/16* (2006.01)

(52) U.S. Cl.
CPC ........ *H01L 23/49838* (2013.01); *H01L 24/06* (2013.01); *H01L 24/48* (2013.01); *H01L 24/49* (2013.01); *H01L 25/167* (2013.01); *H01L 25/18* (2013.01); *H01L 2224/48227* (2013.01); *H01L 2224/49171* (2013.01); *H01L 2924/10161* (2013.01); *H01L 2924/1426* (2013.01)

(58) Field of Classification Search
CPC ... H01L 23/49838; H01L 24/06; H01L 24/48; H01L 24/49; H01L 25/167; H01L 25/18
See application file for complete search history.

(56) References Cited

U.S. PATENT DOCUMENTS

| | | | |
|---|---|---|---|
| 6,987,034 B1* | 1/2006 | Chiang | H01L 21/4821 438/123 |
| 2010/0244209 A1* | 9/2010 | Fukushima | H01L 24/97 257/666 |
| 2013/0009299 A1* | 1/2013 | Takada | H01L 24/77 257/676 |
| 2017/0317598 A1* | 11/2017 | Ptacek | H02M 1/08 |

* cited by examiner

*Primary Examiner* — Marc Anthony Armand
(74) *Attorney, Agent, or Firm* — JCIPRNET

(57) ABSTRACT

An integrated circuit package, a die carrier, and a die are provided. The die carrier includes at least one die pad and a plurality of leads. The at least one die pad is suitable for carrying the die. The leads surround the at least one die pad. The leads are disposed on four sides of the die carrier. A length of a long side among the four sides is twice or more a length of a short side among the four sides. The die carrier is suitable for a QFN package or a QFP package.

18 Claims, 4 Drawing Sheets

INTEGRATED CIRCUIT PACKAGE AND DIE

BACKGROUND

Technical Field

The disclosure relates to an integrated circuit (IC), and particularly, to an IC package, a die carrier, and a die.

Description of Related Art

The light-emitting diode (LED) may be used as a pixel element of a display panel. For example, the mini LED or the micro LED may be used to form LED display panels. The increase in the resolution of the LED display panel means that the number of LED dies per unit area will also increase. In other words, the display device needs more drive channels to drive a large number of LED dies (or pixels). The increase in drive channels means that the number of LED display drivers (IC) has to increase, and/or the number of drive channels of each LED display driver (IC) has to increase. However, the former will encounter the issue that the printed circuit board (PCB) has no more area for placing additional ICs, and the latter requires that the area of the IC should be increased.

FIG. 1 is a schematic view showing a conventional IC package. An IC 100 shown in FIG. 1 is an LED display driver for driving an LED display panel. The package of the IC 100 may be a conventional quad flat no-lead (QFN) package or a conventional quad flat package (QFP). The number of leads of the conventional QFN (or QFP) package shown in FIG. 1 is 8*4=32. Any bonding pad of a conventional die DIE1 may be electrically connected to a corresponding lead of the IC 100 via a bond wire (e.g., a bond wire 101). In the case where the number of drive channels of the conventional die DIE1 needs to be doubled, the area of the conventional die DIE1 will also need to be doubled (or more).

FIG. 2 is a schematic view showing another conventional IC package. An IC 200 shown in FIG. 2 is also an LED display driver. The package of the IC 200 is also a conventional QFN (or QFP) package. The shape of a conventional QFN (or QFP) package is a square. A conventional die DIE2 shown in FIG. 2 may be regarded as a combination of two conventional dies DIE1, or may be regarded as a result of doubling the number of drive channels of the conventional die DIE1. Therefore, compared with the conventional die DIE1 shown in FIG. 1, the area of the conventional die DIE2 shown in FIG. 2 is doubled. Since the number of drive channels is doubled, the number of leads of the IC 200 is 16*4=64. Compared with the conventional QFN (or QFP) package shown in FIG. 1, the number of leads is doubled, and as a result, the area of the conventional QFN (or QFP) package shown in FIG. 2 is increased by four times. The printed circuit board may not have enough area to receive the IC 200 which has an area four times larger.

Furthermore, any bonding pad of the conventional die DIE2 may be electrically connected to a corresponding lead of the IC 200 via a bond wire (e.g., a bond wire 201). Compared with FIG. 1, the area of the conventional QFN (or QFP) package shown in FIG. 2 is increased by four times and the area of the conventional die DIE2 is doubled. In that case, the length of the bond wire 201 will be significantly increased, and the increase in bond wire length means that the bond wire impedance will also increase.

FIG. 3 is a schematic view showing still another conventional IC package. An IC 300 shown in FIG. 3 is also an LED display driver. The package of the IC 300 is the same as the conventional QFN (or QFP) package shown in FIG. 2. The IC 300 is provided with two conventional dies DIE1-1 and DIE1-2. The conventional dies DIE1-1 and DIE1-2 shown in FIG. 3 may be regarded as two conventional dies DIEL Since the number of drive channels is doubled (compared with FIG. 1), the number of leads of the IC 300 is 16*4=64. As mentioned in the description of FIG. 2, the area of the conventional QFN (or QFP) package shown in FIG. 3 is increased by 4 times. The printed circuit board may not have enough area to receive the IC 300 which has an area four times larger. Furthermore, any bonding pad of the conventional dies DIE1-1 and DIE1-2 may be electrically connected to a corresponding lead of the IC 300 via a bond wire (e.g., a bond wire 301). Compared with FIG. 1, the area of the conventional QFN (or QFP) package shown in FIG. 3 is increased by four times. In that case, the length of the bond wire 301 will be significantly increased.

The information disclosed in this Background section is only for enhancement of understanding of the disclosure and therefore it may contain information that does not form the prior art that is already known to a person of ordinary skill in the art. Further, the information disclosed in the Background section does not mean that one or more problems to be resolved by one or more embodiments of the disclosure were acknowledged by a person of ordinary skill in the art.

SUMMARY

The disclosure provides an integrated circuit (IC) package, a die carrier, and a die to reduce the impedance of bond wires as much as possible.

In an embodiment of the disclosure, the die carrier includes at least one die pad and a plurality of leads. The at least one die pad is adapted for carrying at least one die. The leads surround the at least one die pad. The leads are disposed on four sides of the die carrier. A length of a long side among the four sides is twice or more a length of a short side among the four sides. The die carrier is adapted for a quad flat no-lead (QFN) package or a quad flat package (QFP).

In an embodiment of the disclosure, the IC package includes a die carrier, at least one die, and a plurality of bond wires. The die carrier includes at least one die pad and a plurality of leads surrounding the at least one die pad. The leads are disposed on four sides of the die carrier. A length of a long side among the four sides is twice or more a length of a short side among the four sides. The IC package is a QFN package or a QFP package. The at least one die is disposed on the at least one die pad. The bond wires are disposed between the at least one die and the leads.

In an embodiment of the disclosure, the die is adapted for driving a light-emitting diode display panel. The die includes at least one first bonding pad and at least one second bonding pad. The at least one first bonding pad is adapted to be coupled to at least one first wire of the light-emitting diode display panel. The at least one second bonding pad is adapted to be coupled to at least one second wire of the light-emitting diode display panel. An anode and a cathode of a light-emitting diode of the light-emitting diode display panel are respectively coupled to the first wire and the second wire. A length of a long side of the die is twice or more a length of a short side of the die.

Based on the above, the IC package, the die carrier, and the die described in the embodiments adopt a strip-shaped QFN (or QFP) package. The shape of the die carrier may match the shape of the die to reduce bond wire impedance as much as possible.

To make the aforementioned more comprehensible, several embodiments accompanied with drawings are described in detail as follows.

DESCRIPTION OF THE EMBODIMENTS

Throughout the text of the specification (including the claims), the term "couple (or connect)" refers to any direct or indirect connection means. For example, where a first device is described to be coupled (or connected) to a second device in the text, it should be interpreted that the first device may be directly connected to the second device, or that the first device may be indirectly connected to the second device through another device or some connection means. The terms "first", "second", etc. mentioned in the description or claims are used to designate names of elements or distinguish among different embodiments or scopes and are not meant to designate upper or lower limits of numbers of elements. Moreover, wherever applicable, elements/components/steps referenced by the same numerals in the figures and embodiments refer to the same or similar parts. Elements/components/steps referenced by the same numerals or the same language in different embodiments may be mutually referred to for relevant descriptions.

Figure 4:
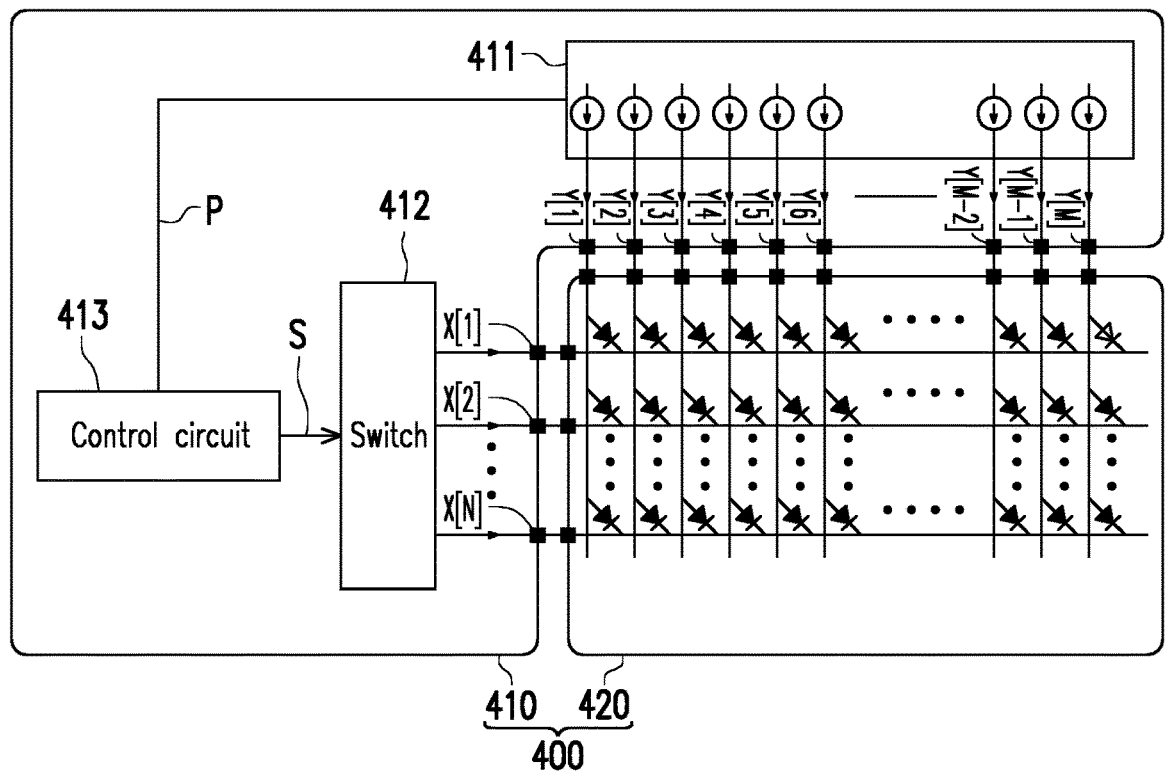
FIG. 4 is a schematic circuit block diagram showing a display device according to an embodiment of the disclosure.

FIG. 4 is a schematic circuit block diagram showing a display device 400 according to an embodiment of the disclosure. The display device 400 includes an LED display driver (IC) 410 and a light-emitting diode (LED) display panel 420. The LED display panel 420 has an LED array. The anode of each LED is coupled to a first wire of the LED display panel 420, and the cathode of each LED is coupled to a second wire of the LED display panel 420. Leads Y[1], Y[2], Y[3], Y[4], Y[5], Y[6], . . . , Y[M−2], Y[M−1], and Y[M] of the LED display driver (IC) 410 are respectively coupled to different first wires of the LED display panel 420. Leads X[1], X[2], . . . , and X[N] of the LED display driver 410 are respectively coupled to different second wires of the LED display panel 420.

The LED display driver (IC) 410 includes a plurality of current sources 411, a plurality of switches 412, and a control circuit 413. The current sources 411 are coupled to the leads Y[1] to Y[M]. The switches 412 are coupled to the leads X[1] to X[N]. The control circuit 413 may output a control signal S to control the switches 412. The control circuit 413 may further provide a pulse width modulation (PWM) signal P to the current sources 411 to control the average current of the current sources 411.

Figure 5:
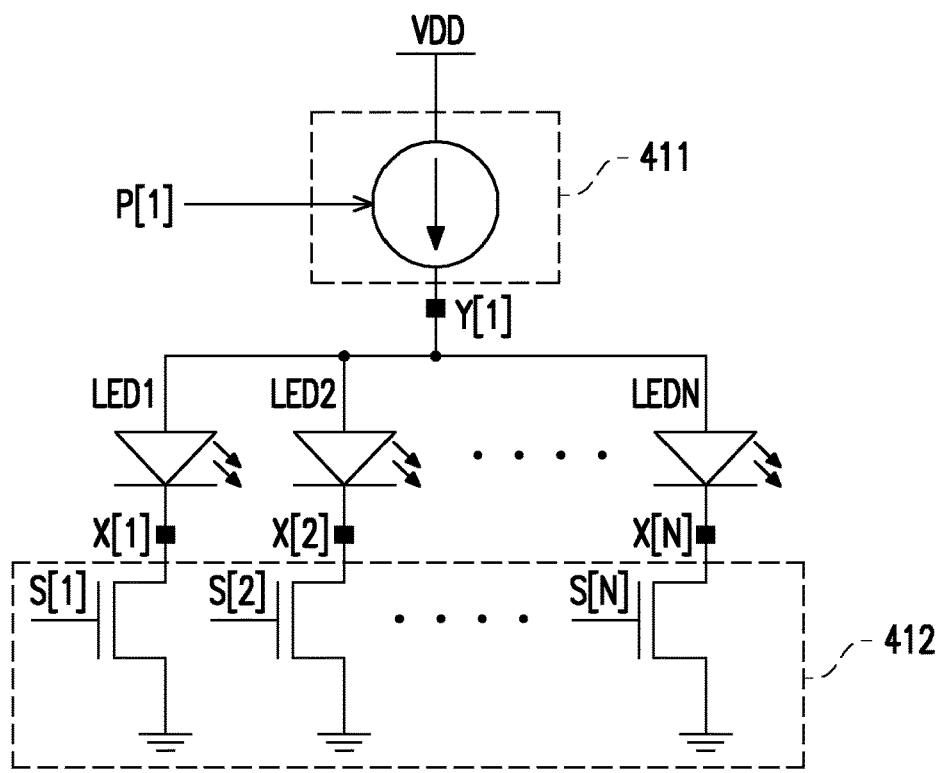
FIG. 5 is a schematic circuit diagram showing a current source and switches shown in FIG. 4 according to an embodiment of the disclosure.

FIG. 5 is a schematic circuit diagram showing the current source 411 and the switches 412 shown in FIG. 4 according to an embodiment of the disclosure. The control terminal of the current source 411 shown in FIG. 5 is coupled to the control circuit 413 to receive a PWM signal P[1] (i.e., one signal among the PWM signals P). The duty ratio of the PWM signal P[1] may determine the average current of the current source 411 shown in FIG. 5. One terminal of the current source 411 shown in FIG. 5 is coupled to a system voltage VDD, and another terminal is coupled to the lead Y[1]. The lead Y[1] is coupled to the anodes of a plurality of LEDs (e.g., LED1, LED2, . . . , and LEDN) via one first wire.

The control terminals of the switches 412 shown in FIG. 5 are coupled to the control circuit 413 to receive control signals S[1], S[2], . . . , and S[N] (i.e., the control signals S). One terminal of the switches 412 is grounded, and another terminal is respectively coupled to the leads X[1] to X[N]. The leads X[1] to X[N] are coupled to the cathodes of a plurality of LEDs (e.g., LED1 to LEDN) via different second wires. The control circuit 413 may scan the second wires of the LED display panel 420 through the control signals S[1] to S[N].

Figure 6:
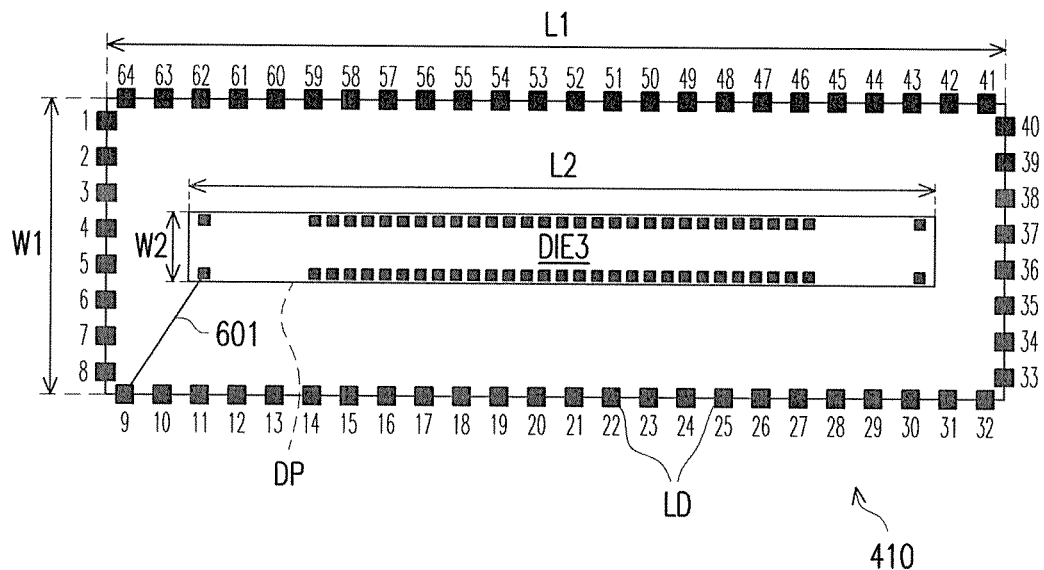
FIG. 6 is a schematic view showing a package of the LED display driver (IC) shown in FIG. 4 according to an embodiment of the disclosure.

FIG. 6 is a schematic view showing a package of the LED display driver (IC) 410 shown in FIG. 4 according to an embodiment of the disclosure. The IC package of the LED display driver 410 shown in FIG. 6 includes a die carrier and at least one die (e.g., a die DIE3). The die carrier has at least one die pad DP and a plurality of leads. The at least one die pad is suitable for carrying the at least one die. In the embodiment shown in FIG. 6, the die DIE3 is disposed on the die pad DP, and the leads LD surround the die pad (or the die DIE3).

The package of the LED display driver (IC) 410 may be a strip-shaped quad flat no-lead (QFN) package or a strip-shaped quad flat package (QFP). In other words, the leads of the LED display driver 410 are disposed on the four sides of the die carrier, and the die carrier is suitable for a strip-shaped QFN (or QFP) package. According to the design requirements, the strip-shaped QFN (or QFP) package may be defined so that that the length of a long side L1 among the four sides of the die carrier is twice or more the length of a short side W1. For example, in some embodiments, the length of the long side L1 is three or more times the length of the short side W1.

The die DIE3 shown in FIG. 6 includes the current sources 411, the switches 412, and the control circuit 413 shown in FIG. 4. The current sources 411 are coupled to the leads Y[1] to Y[M] via a plurality of first bonding pads of the die DIE3. The switches 412 are coupled to the leads X[1] to X[N] via a plurality of second bonding pads of the die DIE3. The long side direction of a long side L2 of the die DIE3 (or the die pad) shown in FIG. 6 is parallel to the long side direction of the long side L1 of the die carrier of the LED display driver (IC) 410. The length of the long side L2 of the die DIE3 (or the die pad) is twice or more the length of a short side W2. For example, in some embodiments, the length of the long side L2 is three or more times the length of the short side W2. In other embodiments, the length of the long side L2 is five or more times the length of the short side W2. In still other embodiments, the length of the long side L2 is eight or more times the length of the short side W2.

Figure 1:
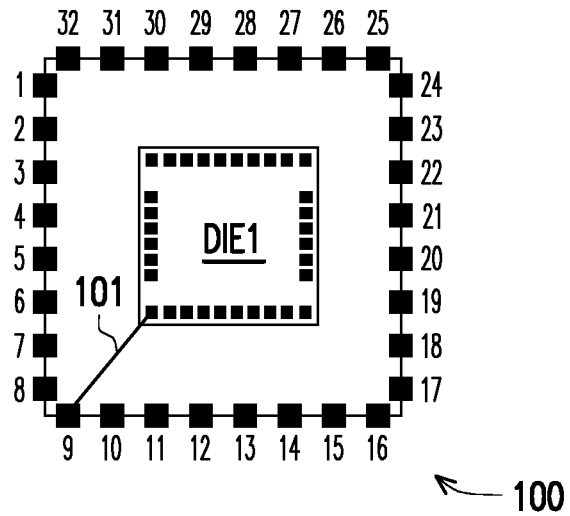
FIG. 1 is a schematic view showing a conventional IC package.
Figure 2:
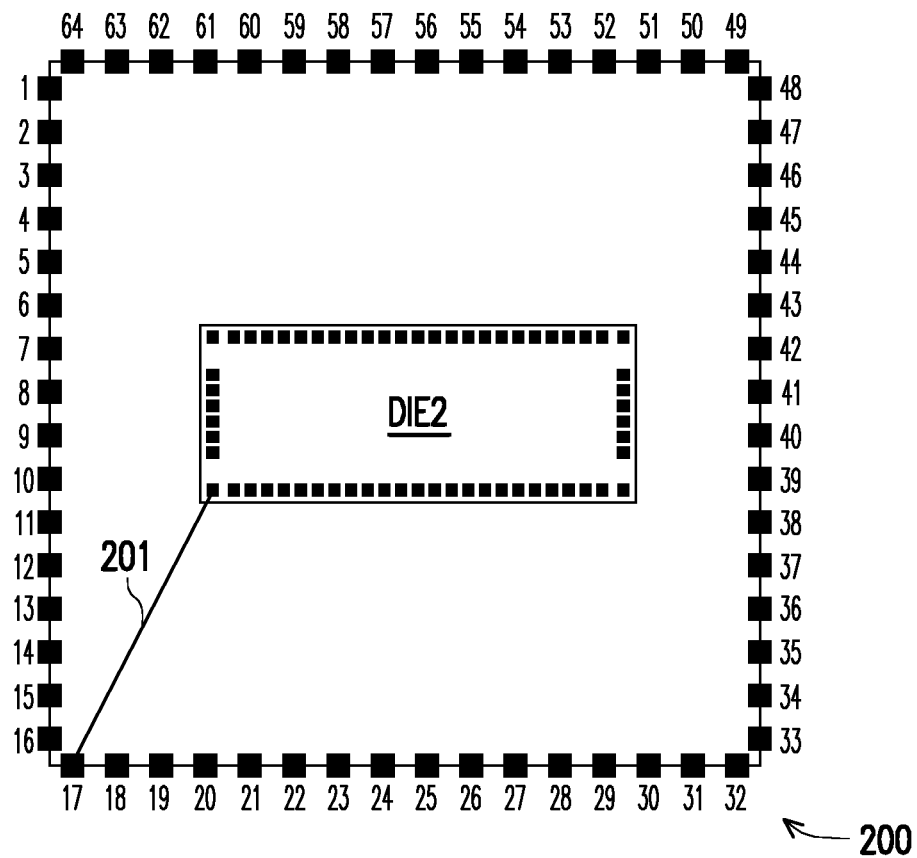
FIG. 2 is a schematic view showing another conventional IC package.

The number of the leads LD of the package of the LED display driver (IC) 410 shown in FIG. 6 is 8*2+24*2=64. A plurality of bond wires are disposed between the bonding pads of the die DIE3 and the leads. Any bonding pad of the die DIE3 may be electrically connected to a corresponding lead of the LED display driver (IC) 410 via the bond wire (e.g., a bond wire 601). Compared with the conventional QFN (or QFP) package shown in FIG. 2, the area of the strip-shaped QFN (or QFP) package shown in FIG. 6 can be effectively reduced. The reduction in area means that more components (e.g., more LED display drivers 410) may be disposed on the printed circuit board. Compared with the bond wire 201 in the conventional QFN (or QFP) package shown in FIG. 2, the length of the bond wire 601 shown in FIG. 6 can be effectively reduced. The reduction in bond wire length means that the bond wire impedance can be effectively reduced.

Figure 7:
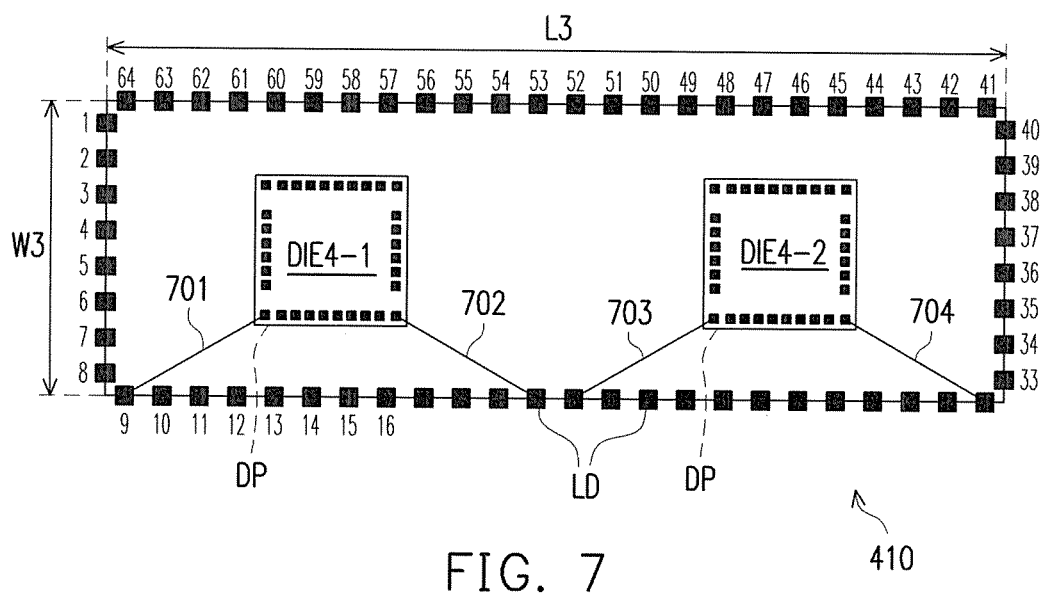
FIG. 7 is a schematic view showing a package of the LED display driver (IC) shown in FIG. 4 according to another embodiment of the disclosure.

FIG. 7 is a schematic view showing a package of the LED display driver (IC) 410 shown in FIG. 4 according to another embodiment of the disclosure. The IC package of the LED display driver 410 shown in FIG. 7 includes a die carrier and two dies DIE4-1 and DIE4-2. The die carrier has two die pads DP and a plurality of leads LD. The two die pads are suitable for carrying the dies DIE4-1 and DIE4-2. In other words, the dies DIE4-1 and DIE4-2 are disposed on different die pads DP, and the leads LD surround the die pads (or the dies DIE4-1 and DIE4-2). In the embodiment shown in FIG. 7, the die DIE4-1 (or a first die pad) and the die DIE4-2 (or a second die pad) are disposed on the die carrier of the LED display driver (IC) 410 along the long side direction of a long side L3 among the four sides of the LED display driver (IC) 410.

The package of the LED display driver (IC) 410 shown in FIG. 7 may be a strip-shaped QFN (or QFP) package. In other words, the leads of the LED display driver 410 are disposed on the four sides of the die carrier of the LED display driver (IC) 410. The length of the long side L3 among the four sides of the die carrier is twice or more the length of a short side W3. For example, in some embodiments, the length of the long side L3 is three or more times the length of the short side W3.

Figure 3:
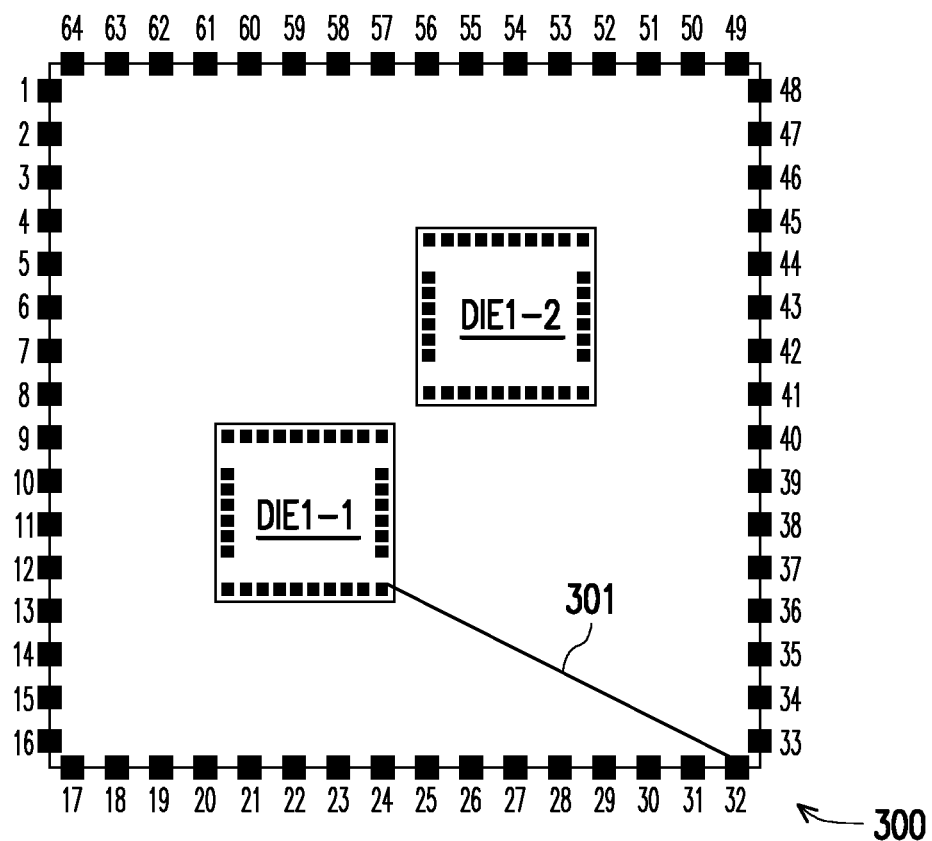
FIG. 3 is a schematic view showing still another conventional IC package.

Reference may be made to the relevant descriptions of the die DIE3 shown in FIG. 6 for descriptions of any of the dies DIE4-1 and DIE4-2 shown in FIG. 7, which shall not be repeatedly described herein. The difference from the die DIE3 shown in FIG. 6 lies in that the number of drive channels of the die DIE4-1 (or the die DIE4-2) shown in FIG. 7 is half the number of drive channels of the die DIE3. A plurality of bond wires are disposed between a plurality of bonding pads of the dies DIE4-1 and DIE4-2 shown in FIG. 7 and the leads of LED display driver (IC) 410 shown in FIG. 7. Any bonding pad of the die DIE4-1 may be electrically connected to a corresponding lead of the LED display driver 410 via the bond wire (i.e., a bond wire 701 or 702). Any bonding pad of the die DIE4-2 may be electrically connected to a corresponding lead of the LED display driver 410 via the bond wire (i.e., a bond wire 703 or 704). Compared with the conventional QFN (or QFP) package shown in FIG. 3, the area of the strip-shaped QFN (or QFP) package shown in FIG. 7 can be effectively reduced. Compared with the bond wire 301 in the conventional QFN (or QFP) package shown in FIG. 3, the lengths of the bond wires 701, 702, 703, and 704 shown in FIG. 7 can be effectively reduced.

In summary of the above, the IC package, the die carrier, and the die described in the above embodiments may adopt a strip-shaped QFN (or QFP) package. The shape of the die carrier may match the shape of the die to reduce bond wire impedance as much as possible.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated circuit package adapted for driving a light-emitting diode display panel, the integrated circuit package comprising:
   a die carrier comprising at least one die pad and a plurality of leads surrounding the at least one die pad, wherein the leads are disposed on four sides of the die carrier, a length of a long side among the four sides is twice or more a length of a short side among the four sides, and the integrated circuit package is a quad flat no-lead package or a quad flat package;
   at least one die disposed on the at least one die pad, wherein the die comprising:
      at least one first bonding pad adapted to be coupled to at least one first wire of the light-emitting diode display panel;
      at least one second bonding pad adapted to be coupled to at least one second wire of the light-emitting diode display panel;
      at least one current source coupled to the at least one first bonding pad;
      at least one switch coupled to the at least one second bonding pad; and
      a control circuit configured to control the at least one switch and provide at least one pulse width modulation signal to the at least one current source, wherein an anode and a cathode of a light-emitting diode of the light-emitting diode display panel are respectively coupled to the first wire and the second wire; and
   a plurality of bond wires disposed between the at least one die and the leads, wherein the plurality of bond wires comprises the at least one first wire and the at least one second wire.

2. The integrated circuit package according to claim 1, wherein the length of the long side of the die carrier is three or more times the length of the short side of the die carrier.

3. The integrated circuit package according to claim 1, wherein the at least one die pad comprises:
   a first die pad; and
   a second die pad, wherein the first die pad and the second die pad are disposed on the die carrier along a long side direction of the long side among the four sides.

4. The integrated circuit package according to claim 1, wherein a long side direction of a long side of the at least one die pad is parallel to a long side direction of the long side of the die carrier.

5. The integrated circuit package according to claim 1, wherein a length of a long side of the at least one die is twice or more a length of a short side of the at least one die.

6. The integrated circuit package according to claim 1, wherein a length of a long side of the at least one die is three or more times a length of a short side of the at least one die.

7. The integrated circuit package according to claim 1, wherein a length of a long side of the at least one die is five or more times a length of a short side of the at least one die.

8. The integrated circuit package according to claim 1, wherein a length of a long side of the at least one die is eight or more times a length of a short side of the at least one die.

9. The integrated circuit package according to claim 1, wherein the length of the long side of the die carrier is three or more times the length of the short side of the die carrier.

10. The integrated circuit package according to claim 4, wherein a length of the long side of the at least one die pad is twice or more a length of a short side of the at least one die pad.

11. The integrated circuit package according to claim 4, wherein a length of the long side of the at least one die pad is three or more times a length of a short side of the at least one die pad.

12. The integrated circuit package according to claim 4, wherein a length of the long side of the at least one die pad is five or more times a length of a short side of the at least one die pad.

13. The integrated circuit package according to claim 4, wherein a length of the long side of the at least one die pad is eight or more times a length of a short side of the at least one die pad.

14. The integrated circuit package according to claim 3, wherein the at least one die comprises:
a first die disposed on the first die pad; and
a second die disposed on the second die pad.

15. A die adapted for driving a light-emitting diode display panel, the die comprising:
at least one first bonding pad adapted to be coupled to at least one first wire of the light-emitting diode display panel;
at least one second bonding pad adapted to be coupled to at least one second wire of the light-emitting diode display panel;
at least one current source coupled to the at least one first bonding pad;
at least one switch coupled to the at least one second bonding pad; and
a control circuit configured to control the at least one switch and provide at least one pulse width modulation signal to the at least one current source, wherein an anode and a cathode of a light-emitting diode of the light-emitting diode display panel are respectively coupled to the first wire and the second wire,
wherein a length of a long side of the die is twice or more a length of a short side of the die.

16. The die according to claim 15, wherein the length of the long side of the die is three or more times the length of the short side of the die.

17. The die according to claim 15, wherein the length of the long side of the die is five or more times the length of the short side of the die.

18. The die according to claim 15, wherein the length of the long side of the die is eight or more times the length of the short side of the die.

* * * * *